United States Patent
Shiragami et al.

(10) Patent No.: US 12,017,439 B2
(45) Date of Patent: Jun. 25, 2024

(54) JOINED BODY PRODUCTION METHOD AND JOINED BODY PRODUCTION DEVICE

(71) Applicant: NIPPON ELECTRIC GLASS CO., LTD., Shiga (JP)

(72) Inventors: Toru Shiragami, Otsu (JP); Tatsuya Nagata, Otsu (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 9 days.

(21) Appl. No.: 17/634,116

(22) PCT Filed: Aug. 4, 2020

(86) PCT No.: PCT/JP2020/029830
§ 371 (c)(1),
(2) Date: Feb. 9, 2022

(87) PCT Pub. No.: WO2021/029279
PCT Pub. Date: Feb. 18, 2021

(65) Prior Publication Data
US 2022/0314594 A1 Oct. 6, 2022

(30) Foreign Application Priority Data
Aug. 14, 2019 (JP) .................................. 2019-148816

(51) Int. Cl.
*B32B 37/12* (2006.01)
*B32B 7/14* (2006.01)
(Continued)

(52) U.S. Cl.
CPC ............ *B32B 37/1207* (2013.01); *B32B 7/14* (2013.01); *B32B 17/06* (2013.01);
(Continued)

(58) Field of Classification Search
CPC ............ B32B 37/0046; B32B 37/1018; B32B 37/1292; B32B 2457/206; B32B 2457/208; H01L 21/52; H03H 9/1021
(Continued)

(56) References Cited

U.S. PATENT DOCUMENTS

2013/0292041 A1* 11/2013 Mizoguchi .............. B29C 51/16
156/196
2018/0134023 A1 5/2018 Lu

FOREIGN PATENT DOCUMENTS

JP 2014052330 A 3/2014
JP 2014236202 A 12/2014

* cited by examiner

*Primary Examiner* — Carson Gross
(74) *Attorney, Agent, or Firm* — Cesari & McKenna, LLP (57) ABSTRACT

Disclosed is a method for manufacturing a bonded body that includes a glass member, a bonding subject member, and a bonding portion bonded to the glass member and the bonding subject member. The method includes a setting step, a pressing step, and a bonding portion formation step. The setting step is a step of setting a jig main body lid on a jig main body in a state in which a stack is disposed in a recess of the jig main body. The pressing step is a step of adjusting an atmospheric pressure in the recess of the jig main body after the setting step to press the stack with the jig main body lid. The bonding portion formation step is a step of forming the bonding portion from a bonding material included in the stack in a state in which the stack is pressed in the pressing step.

12 Claims, 4 Drawing Sheets

(51) Int. Cl.
*B32B 17/06* (2006.01)
*B32B 37/00* (2006.01)
*B32B 37/10* (2006.01)
*B32B 37/18* (2006.01)
*C03C 27/10* (2006.01)
*H01L 21/52* (2006.01)

(52) U.S. Cl.
CPC .......... *B32B 37/0046* (2013.01); *B32B 37/10* (2013.01); *B32B 37/1292* (2013.01); *B32B 37/18* (2013.01); *C03C 27/10* (2013.01); *B32B 2315/08* (2013.01); *H01L 21/52* (2013.01)

(58) Field of Classification Search
USPC ........................................................ 156/265
See application file for complete search history.

JOINED BODY PRODUCTION METHOD AND JOINED BODY PRODUCTION DEVICE

CROSS REFERENCE TO RELATED APPLICATIONS

The present application is a 35 U.S.C. § 371 National Stage Application of International Application No. PCT/JP2020/029830, filed on Aug. 4, 2020, which claims priority to Japanese Application Number 2019-148816 filed Aug. 14, 2019, the disclosures of which are hereby incorporated by reference.

TECHNICAL FIELD

The present invention relates to a method and an apparatus for manufacturing a bonded body.

BACKGROUND ART

Patent Document 1 discloses a known method for manufacturing a bonded body such as a package by bonding a glass member such as a glass lid and a bonding subject member such as a glass ceramic container with a bonding material.

PRIOR ART LITERATURE

Patent Literature

Patent Document 1: Japanese Laid-Open Patent Publication No. 2014-236202

SUMMARY OF THE INVENTION

Problems that the Invention is to Solve

Preferably, with the bonded body, a stack is formed by arranging the bonding material between the glass member and the bonding subject member, and then the bonding material is heated to bond the glass member and the bonding subject in a state in which the stack is pressed in a thicknesswise direction of the stack. When the members are bonded in a state in which the stack is pressed, the bonding strength of the glass member and the bonding subject member is increased. However, for example, when a tightening tool is used to press the stack, the pressing force is likely to be applied locally to the bonding material of the stack. This may partially lower the adhesiveness of the bonding material to the glass member and the bonding subject member.

The present invention is made in view of such circumstances, and an objective of the present invention is to provide a method and an apparatus for manufacturing a bonded body that increases the adhesiveness of the entire bonding material to the glass member and the bonding subject member.

Means for Solving the Problems

A method for manufacturing a bonded body that solves the above problem includes a stack preparation step, a jig preparation step, a setting step, a pressing step, and a bonding portion formation step. The bonded body includes a glass member, a bonding subject member, and a bonding portion bonded to the glass member and the bonding subject member. The stack preparation step is a step of preparing a stack in which a bonding material is disposed between the glass member and the bonding subject member. The jig preparation step is a step of preparing a jig. The jig includes a jig main body that has a recess, in which the stack is disposed, and a jig main body lid configured to close an opening of the recess in the jig main body. The setting step is a step of setting the jig main body lid on the jig main body in a state in which the stack is disposed in the recess of the jig main body. The pressing step is a step of adjusting an atmospheric pressure in the recess of the jig main body after the setting step to press the stack with the jig main body lid. The bonding portion formation step is a step of forming the bonding portion, which is bonded to the glass member and the bonding subject member, from the bonding material in a state in which the stack is pressed in the pressing step.

With this method, the pressing force of the jig main body lid applied to the glass member is adjusted in the pressing step by regulating the atmospheric pressure inside the recess of the jig main body instead of mechanically adjusting the pressing force of the jig main body lid with a tightening tool. This avoids a situation in which the pressing force of the jig main body lid is locally applied to the stack.

In the bonded body manufacturing method, it is preferred that in the setting step, the jig main body lid contact the glass member or the bonding subject member of the stack.

This method accelerates pressing of the glass member of the stack by the jig main body lid in the pressing step.

In the bonded body manufacturing method, it is preferred that in the pressing step, the bonding subject member or the glass member be biased toward the jig main body lid.

With this method, the force acting on the bonding material between the glass member and the bonding subject member is adjusted by the biasing force. This stabilizes the force acting between the glass member and the bonding material and between the bonding subject member and the bonding material.

In the bonded body manufacturing method, it is preferred that in the pressing step, the atmospheric pressure be adjusted by discharging gas out of the recess of the jig main body.

This method accelerates the pressing step.

In the bonded body manufacturing method, it is preferred that the pressing step be a step of pressing the glass member of the stack toward the bonding subject member of the stack.

In the bonded body manufacturing method, it is preferred that the glass member have the form of a plate or a container including an opening, that the bonding subject member have the form of a plate or a container including an opening, that the bonding material of the stack in the stack preparation step include glass, that the jig main body lid be a glass plate, and that in the bonding portion formation step, a laser beam be transmitted through the jig main body lid and the glass member and emitted to the bonding material to heat the bonding material.

With this method, the bonding material is locally heated by the laser beam in the bonding portion formation step. This limits, for example, temperature increases at portions other than the bonding material that do not have to be heated.

In the bonded body manufacturing method, it is preferred that in the bonding portion formation step, the jig main body lid be in contact with and supported by a packing arranged on the jig main body in a state in which the jig main body lid is spaced apart from the jig main body.

This method allows the drawing force from the recess of the jig main body to maintain a state in which the jig main body lid further uniformly presses the glass member. Thus, the bonding portion formation step is performed in a state in which the adhesiveness of the entire bonding material to the glass member and the bonding subject member is increased.

In the bonded body manufacturing method, the glass member and the bonding subject member may each have the form of a plate. Further, the bonding material may have the form of a plurality of frames.

In the bonded body manufacturing method, it is preferred that the stack in the stack preparation step include a spacer located between the glass member and the bonding subject member.

This method prevents the component such as an electronic component, which is disposed between the glass member and the bonding subject member, from receiving unnecessary compressing force in the pressing step and the bonding portion formation step.

The bonded body manufacturing method may further include a cutting step of cutting the bonded body after the bonding portion formation step at a position between a plurality of frames of the bonding portion formed from the plurality of frames of the bonding material.

In the bonded body manufacturing method, it is preferred that the jig main body lid be a glass plate having a thickness in a range of 1.5 mm or greater and 5.0 mm or less and an elasticity in a range of 65 GPa or greater and 85 GPa or less.

It is preferred that a bonded body manufacturing apparatus used in the bonded body manufacturing method includes the jig.

In the bonded body manufacturing apparatus, it is preferred that the jig main body of the jig further include a biasing portion that biases the stack disposed in the recess toward the jig main body lid and that the biasing portion include a main biasing body and a biasing plate. The biasing portion counters a compressing force. The biasing plate is disposed between the main biasing body and the stack.

With this configuration, the biasing plate uniformly transmits the biasing force of the main biasing body. Thus, the biasing force of the main biasing body is transmitted further uniformly to the stack.

Effect of the Invention

The present invention succeeds in increasing the adhesiveness of the entire bonding material to the glass member and the bonding subject member.

MODES FOR CARRYING OUT THE INVENTION

An embodiment of a method for manufacturing a bonded body will now be described with reference to the drawings.

To facilitate understanding, some of the elements may be shown in an exaggerated or simplified manner in the drawings. Further, elements s may not be drawn to scale.

Figure 1A:
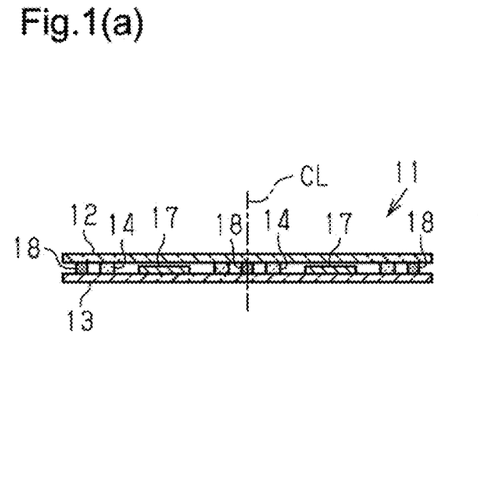
FIG. 1(a) is a cross-sectional view showing a bonded body in accordance with an embodiment.
Figure 1B:
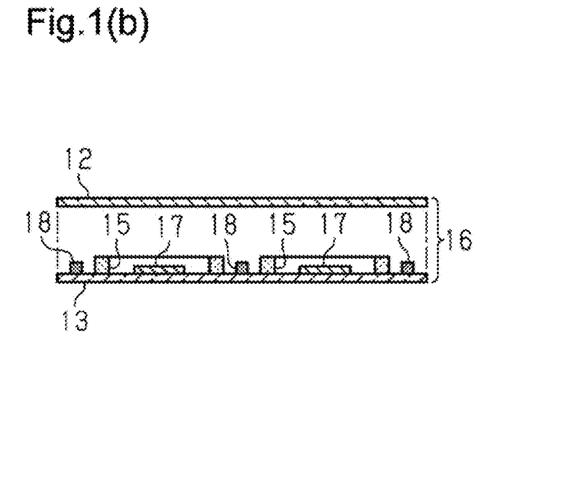
FIG. 1(b) is a cross-sectional view showing the bonded body in a disassembled state.
Figure 2A:
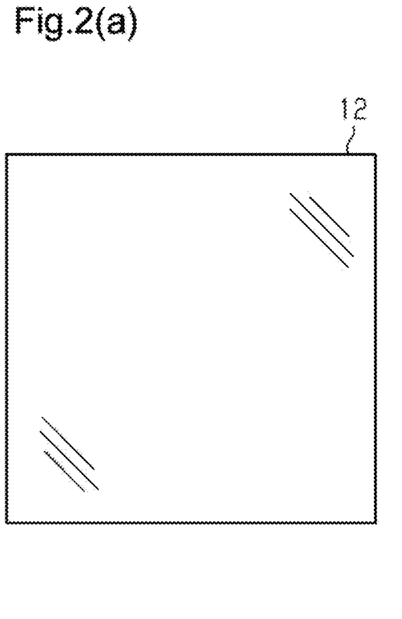
FIG. 2(a) is a plan view of a glass member.
Figure 2B:
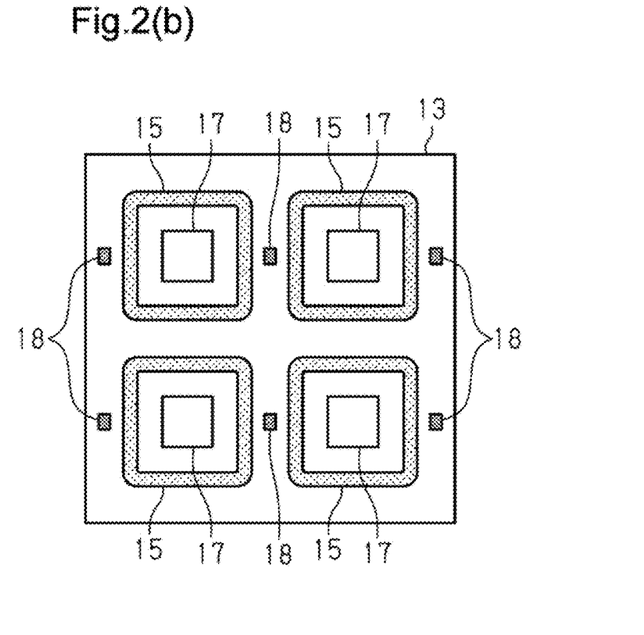
FIG. 2(b) is a plan view of a bonding subject member.

As shown in FIG. 1(a), a bonded body 11 includes a glass member 12, a bonding subject member 13, and a bonding portion 14. The bonding portion 14 is bonded to the glass member 12 and the bonding subject member 13. As shown in FIGS. 1(b), 2(a), and 2(b), the bonded body 11 is obtained from a stack 16 in which a bonding material 15 is arranged between the glass member 12 and the bonding subject member 13.

<Glass Member 12>

Examples of the glass member 12 include alkali-free glass, borosilicate glass, and soda-lime glass. The thickness of the glass member 12 is, for example, in a range of 4 µm or greater and 1000 µm or less. The glass member 12 may have the shape of a flat plate. Alternatively, the glass member 12 may include unevenness and may have a partially recessed form.

<Bonding Subject Member 13>

The bonding subject member 13 includes, for example, a substrate such as a glass substrate, a glass ceramic substrate, or a ceramic substrate. A glass forming the substrate is, for example, quartz glass, silicate-based glass, borate-based glass, borosilicate-based glass, phosphate-based glass, borophosphate-based glass, alkali-free glass, or LAS-type glass. A glass ceramic forming the substrate includes glass and ceramic and is, for example, low temperature co-fired ceramic (LTCC). A ceramic forming the substrate includes, for example, at least one selected from cordierite, willemite, alumina, aluminum nitride, a zirconium phosphate compound, zircon, zirconia, tin oxide, β-quartz solid solution, β-eucryptite, and β-spodumene.

The bonding subject member 13 may include a film arranged on the substrate. Examples of the film include a transparent conductive film and an oxide film. A transparent conductive film is, for example, ITO film, FTO film, or ATO film.

<Bonding Material 15>

Preferably, the bonding material 15 includes glass. Examples of the glass include silicate-based glass, bismuth oxide-based glass, phosphate-based glass, lead oxide-based glass, tellurium oxide-based glass, and vanadium oxide-based glass.

The raw material of the glass included in the bonding material 15 may be of one or more of the above-mentioned glasses in a powdered state.

Preferably, the bonding material 15 includes a filler. A filler is, for example, at least one selected from cordierite, willemite, alumina, aluminum nitride, a zirconium phosphate compound, zircon, zirconia, tin oxide, β-quartz solid solution, β-eucryptite, and β-spodumene.

Preferably, the median diameter (D50) of particles of the glass powder or particles of the filler is less than 2 µm. Preferably, the 99th percentile diameter (D99) of the particles of glass powder or the particles of filler is less than 15 µm.

The bonding material 15 may be prepared with a paste in which the glass powder, the filler, a binder, a solvent, and the like are mixed. Specifically, the paste is applied to the glass member 12 or the bonding subject member 13 through a printing process such as screen printing or by using a dispenser. The bonding material 15 may be the paste applied to the glass member 12 or the bonding subject member 13. Preferably, the bonding material 15 is obtained by heat-treating the paste and sintering the paste on the glass member 12 or the bonding subject member 13.

In the present embodiment, the bonding material 15 has the form of a plurality of frames between the glass member 12 and the bonding subject member 13.

The thickness (height) of the bonding material 15 disposed on the glass member 12 or the bonding subject member 13 is preferably in a range of 1 μm or greater and 1000 μm or less, more preferably, in a range of 2 μm or greater and 100 μm or less, and further preferably, in a range of 3 μm or greater and 10 μm. For example, the width of the bonding material 15 is preferably in a range of 1 μm or greater and 10000 μm or less, more preferably, in a range of 10 μm or greater and 5000 μm or less, and further preferably, in a range of 50 μm or greater and 1000 μm or less.

<Component 17>

The bonded body 11 and the stack 16 may include a component 17 located between the glass member 12 and the bonding subject member 13. Examples of the component 17 include an optical device, such as a laser module, an LED light source, a light sensor, an image capturing element, and an optical switch; a display, such as a liquid crystal display and an organic EL display; a solar cell; a vibration sensor; an acceleration sensor; and an electrode.

<Spacer 18>

In the present embodiment, spacers 18 are arranged in the bonded body 11 between the glass member 12 and the bonding subject member 13. The spacers 18 are arranged so that the distance between the glass member 12 and the substrate of the bonding subject member 13 will not be less than or equal to a predetermined dimension. In the present embodiment, the spacers 18 are located outside the frame-shaped bonding material 15 in plan view. Preferably, the spacers 18 are arranged both inside and outside the frame-shaped bonding material 15 in plan view. This structure further ensures that the distance between the glass member 12 and the bonding subject member 13 is constant. There is no limitation to such a structure and the spacers 18 may be arranged only inside the frame-shaped bonding material 15 in plan view.

The material of the spacer 18 is, for example, a molded body including the above-described glass powder or a molded body of an inorganic material or a resin material.

Specific examples of the application of the bonded body 11 include an organic EL device, such as an organic EL display or an organic EL lighting device; a solar cell, such as a dye sensitized solar cell, a perovskite solar cell, an organic thin film solar cell, or a CIGS-based compound thin film solar cell; a sensor package, such as an MEMS package; and an LED package that emits a light, such as deep ultraviolet light.

As illustrated in FIG. 1(a), the bonded body 11 may be, for example, cut between the frame-shaped bonding portions 14 along a cutting line CL indicated by the double-dashed line. For example, the bonded body 11 is folded and split along a scribed line formed by a chip wheel or a laser beam.

<Method for Manufacturing Bonded Body>

Figure 7:
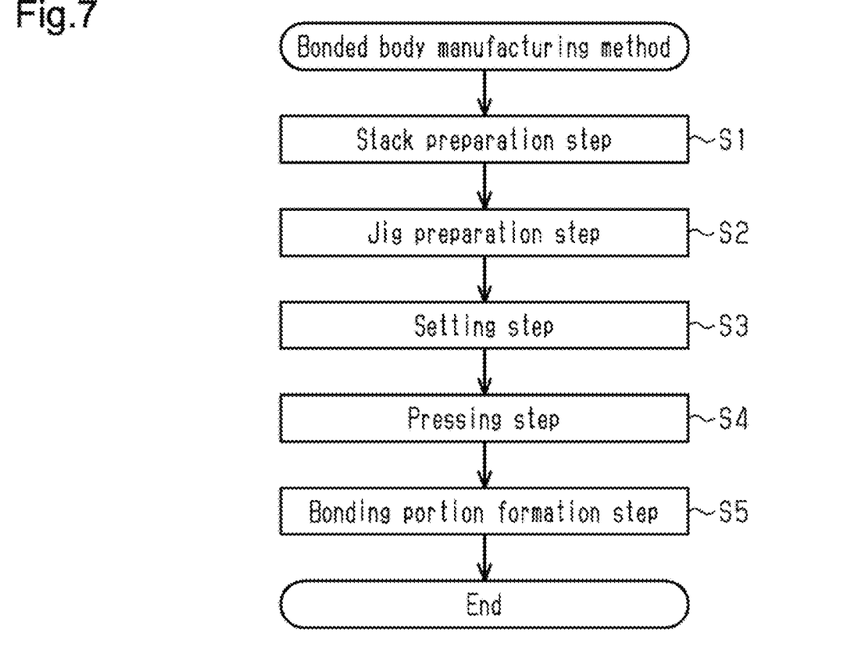
FIG. 7 is a flowchart illustrating the method for manufacturing the bonded body.

As shown in FIG. 7, the method for manufacturing the bonded body 11 includes step S1 of a stack preparation step, step S2 of a jig preparation step, step S3 of a setting step, step S4 of a pressing step, and step S5 of a bonding portion formation step.

In step S1 of the stack preparation step, the stack 16 is prepared by arranging the bonding material 15 between the glass member 12 and the bonding subject member 13. The stack 16 in the present embodiment further includes the spacers 18 located between the glass member 12 and the bonding subject member 13.

Figure 3:
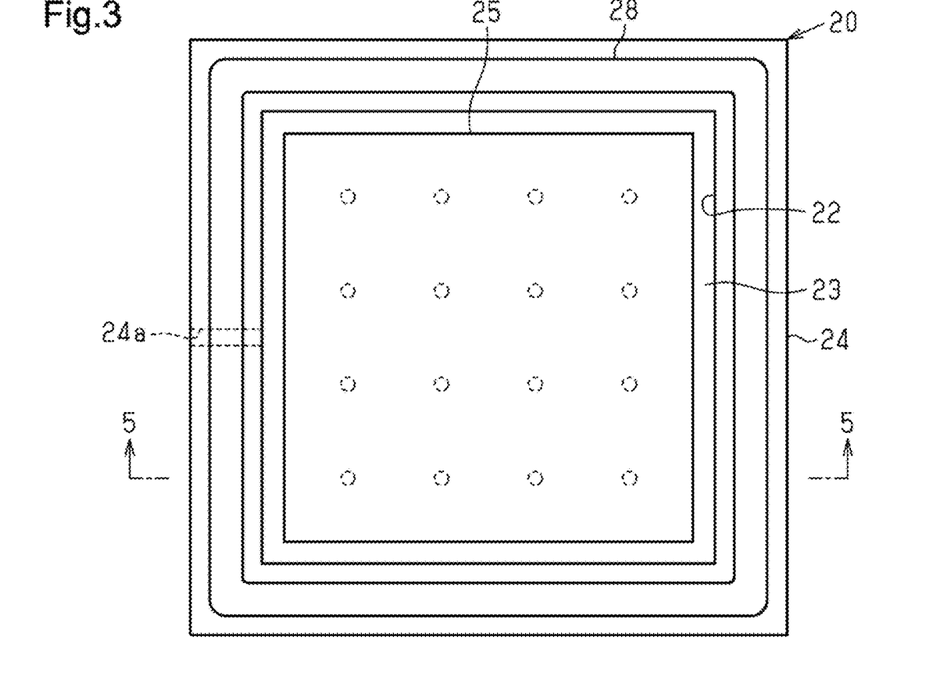
FIG. 3 is a plan view showing a main body of a jig.
Figure 4:
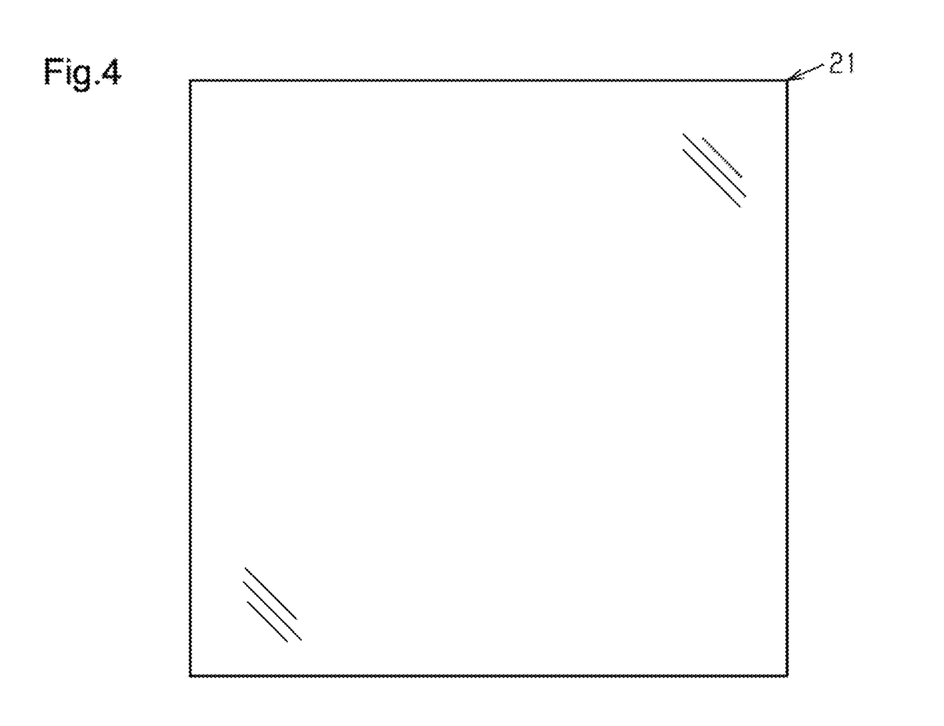
FIG. 4 is a plan view showing a jig main body lid.
Figure 5:
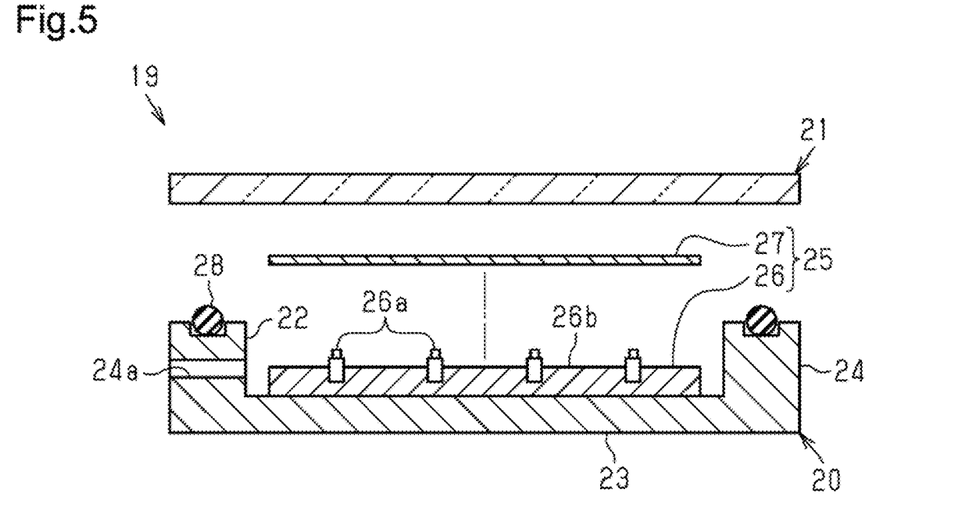
FIG. 5 is a cross-sectional view of the jig main body and the lid taken along line 5-5 in FIG. 3.

As shown in FIGS. 3 to 5, a jig 19 is prepared in step S2 of the jig preparation step. The jig 19 includes a jig main body 20 and a jig main body lid 21. The jig main body 20 has a recess 22 in which the stack 16 is disposed. The jig main body lid 21 is configured to close the opening of the recess 22 in the jig main body 20. The jig 19 forms an apparatus for manufacturing the bonded body 11.

As shown in FIGS. 3 and 5, the jig main body 20 includes a bottom 23 and a peripheral wall 24 that extends from the bottom 23. The recess 22 is formed inside the peripheral wall 24. The peripheral wall 24 of the jig main body 20 includes a venthole 24a that allows gas to be discharged out of the recess 22. The bottom 23 of the jig main body 20 may include the venthole 24a.

The jig main body 20 further includes a biasing portion 25 that biases the stack 16 disposed in the recess 22 of the jig main body 20 toward the jig main body lid 21. The biasing portion 25 of the jig main body 20 includes a main biasing body 26 and a biasing plate 27. The main biasing body 26 counters compressing force. The biasing plate 27 is disposed on the main biasing body 26. The stack 16 is disposed on the biasing portion 25 such that the bonding subject member 13 of the stack 16 face the biasing plate 27 of the biasing portion 25. Therefore, the biasing plate 27 is arranged between the main biasing body 26 and the stack 16, specifically, between the main biasing body 26 and the bonding subject member 13. The main biasing body 26 in the present embodiment includes plungers 26a and a base 26b on which the plungers 26a are mounted. Each plunger 26a serving as a biasing member includes a plunger main body that incorporates a compression coil spring (not shown) and a pin that is biased by the compression coil spring. The biasing plate 27 transmits the biasing force of the main biasing body 26 uniformly to the bonding subject member 13. Examples of the biasing plate 27 include a metal plate, such as a stainless-steel plate, a glass plate, a ceramic plate, and a resin plate. The biasing plate 27 includes a flat upper surface so as to come into planar contact with the lower surface of the bonding subject member 13 of the stack 16. Instead of the plunger 26a, the main biasing body 26 may include, for example, a compression coil spring, a leaf spring, or a polymer material, which is elastic such as rubber, as a biasing member. The biasing member may be of a single type or a combination of multiple types.

The jig main body 20 includes a packing 28 arranged on a distal end (upper end) of the peripheral wall 24. The packing 28 extends over the entire periphery of the peripheral wall 24 and is in close contact with the jig main body lid 21 to ensure that the recess 22 of the jig main body 20 is airtight. The packing 28 may be, for example, an O-ring formed from an elastic material, such as rubber.

The jig main body lid 21 of the jig 19 in the present embodiment is light-transmissive. Preferably, the light-transmissive jig main body lid 21 is a glass plate. Preferably, the jig main body lid 21 has a thickness in a range of 1.5 mm or greater and 5.0 mm or less. Preferably, the jig main body lid 21 has an elasticity in a range of 65 GPa or greater and 85 GPa or less.

Figure 6:
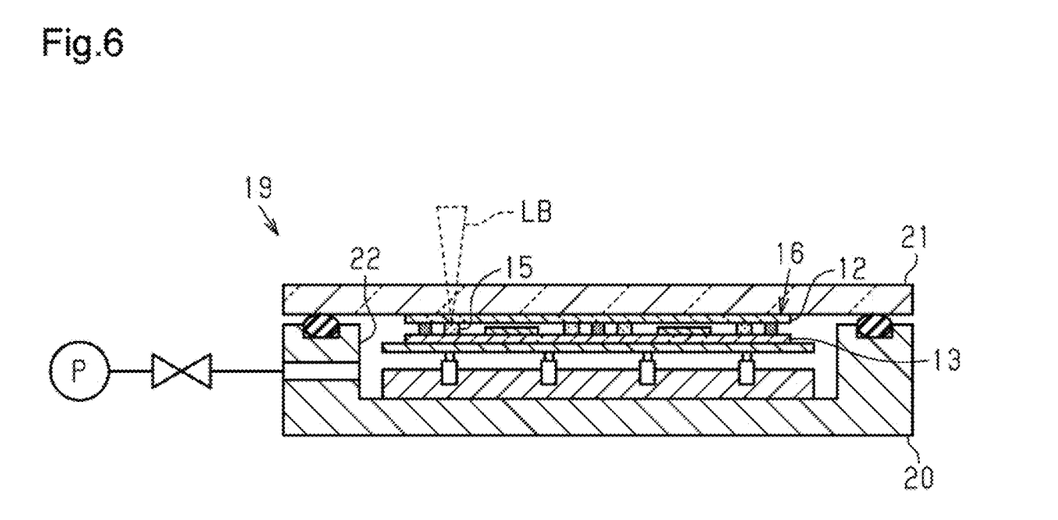
FIG. 6 is a cross-sectional view illustrating a method for manufacturing the bonded body.

As shown in FIG. 6, in step S3 of the setting step, the jig main body lid 21 is set on the jig main body 20 in a state in which the stack 16 is disposed in the recess 22 of the jig main body 20. In step S4 of the pressing step, the atmospheric pressure in the recess 22 of the jig main body 20 is adjusted to press the stack 16 with the jig main body lid 21. In step S4 of the pressing step in the present embodiment, the jig main body lid 21 presses the glass member 12 of the stack 16 toward the bonding subject member 13 of the stack 16.

Specifically, a pump is used to discharge gas out of the recess 22 of the jig main body 20. This obtains a reduced pressure atmosphere inside the recess 22 of the jig main body 20 in which the atmospheric pressure is lower than the atmospheric pressure outside the recess 22. For example, an adjustment valve arranged in a pipe connecting the pump and the venthole 24*a* is used to adjust the atmospheric pressure inside the recess 22 of the jig main body 20 and obtain a predetermined reduced pressure atmosphere. In this manner, the jig main body lid 21 is drawn toward the recess 22 of the jig main body 20, and the jig main body lid 21 presses the glass member 12 toward the bonding subject member 13 in a state in which the jig main body lid 21 is in contact with the glass member 12 of the stack 16. In this case, the jig main body lid 21 is drawn toward the recess 22 of the jig main body 20. This allows the jig main body lid 21 to deform and bulge toward the glass member 12 of the stack 16. The bulging deformation of the jig main body lid 21 improves the adhesion between the jig main body lid 21 and the glass member 12.

In step S5 of the bonding portion formation step, the bonding portion 14 that is bonded to the glass member 12 and the bonding subject member 13 is formed from the bonding material 15 in a state in which the stack 16 is pressed in step S4 of the pressing step. The above-described bonded body 11 is obtained in this manner. In step S5 of the bonding portion formation step, it is preferred that the jig main body lid 21 be in contact with and supported by the packing 28 in a state in which the jig main body lid 21 is spaced apart from the jig main body 20.

In step S5 of the bonding portion formation step in the present embodiment, a laser beam LB is used to heat the bonding material 15. More specifically, in step S5 of the bonding portion formation step, the laser beam LB is transmitted sequentially through the jig main body lid 21 and the glass member 12 and emitted to the bonding material 15. The wavelength of the laser beam LB is not particularly limited as long as the bonding material 15 is heated. Preferably, the wavelength of the laser beam LB is, for example, in a range of 600 to 1600 nm. Preferably, a light source that emits the laser beam LB is, for example, a semiconductor laser.

In the bonded body manufacturing method, a plurality of bonded bodies may be obtained by performing a cutting step in which the bonded body 11 is cut at a position between the frame-shaped bonding portions 14 after step S5 of the bonding portion formation step.

The operation and advantages of the present embodiment will now be described.

(1) In step S1 of the stack preparation step in the bonded body manufacturing method, the stack 16 is prepared by arranging the bonding material 15 between the glass member 12 and the bonding subject member 13. The jig 19 prepared in step S2 of the jig preparation step includes the jig main body 20 and the jig main body lid 21. The jig main body 20 includes the recess 22 in which the stack 16 is disposed. The jig main body lid 21 is configured to close the opening of the recess 22 in the jig main body 20. The bonded body manufacturing method further includes step S3 of the setting step, step S4 of the pressing step, and step S5 of the bonding portion formation step. In step S3 of the setting step, the jig main body lid 21 is set on the jig main body 20 in a state in which the stack 16 is disposed in the recess 22 of the jig main body 20. In step S4 of the pressing step after step S3 of the setting step, the atmospheric pressure in the recess 22 of the jig main body 20 is adjusted to press the stack 16 with the jig main body lid 21. In step S5 of the bonding portion formation step, the bonding portion 14 is formed from the bonding material 15 in a state in which the stack 16 is pressed in step S4 of the pressing step.

With this method, the pressing force of the jig main body lid 21 applied to the glass member 12 is adjusted in step S4 of the pressing step by regulating the atmospheric pressure inside the recess 22 of the jig main body 20 instead of mechanically adjusting the pressing force of the jig main body lid 21 with a tightening tool. This avoids a situation in which the pressing force of the jig main body lid 21 is locally applied to the glass member 12 of the stack 16. Therefore, the adhesiveness of the entire bonding material 15 to the glass member 12 and the bonding subject member 13 is easily increased. This reduces, for example, connection failures between the glass member 12 and the bonding subject member 13 and improves the reliability of the bonding portion 14 in the bonded body 11, which is obtained in step S5 of the bonding portion formation step.

(2) In step S3 of the setting step, it is preferred that the jig main body lid 21 contact the glass member 12 of the stack 16. This accelerates pressing of the glass member 12 of the stack 16 by the jig main body lid 21 in step S4 of the pressing step.

(3) In step S4 of the pressing step, it is preferred that the bonding subject member 13 be biased toward the jig main body lid 21. In this case, the force acting on the bonding material 15 between the glass member 12 and the bonding subject member 13 is adjusted by the biasing force. This stabilizes the force acting between the glass member 12 and the bonding material 15 and between the bonding subject member 13 and the bonding material 15.

(4) In step S4 of the pressing step, it is preferred that the atmospheric pressure inside the recess 22 of the jig main body 20 be adjusted by discharging gas out of the recess 22 of the jig main body 20. This accelerates step S4 of the pressing step.

(5) In step S4 of the pressing step, the glass member 12 of the stack 16 is pressed toward the bonding subject member 13 of the stack 16. Preferably, the glass member 12 and the bonding subject member 13 each have the form of a plate. Preferably, the bonding material 15 of the stack 16, which is prepared in step S1 of the stack preparation step, includes glass. The jig main body lid 21 prepared in step S2 of the jig preparation step is a glass plate. In step S5 of the bonding portion formation step, the laser beam LB transmitted through the jig main body lid 21 and the glass member 12 is emitted to the bonding material 15 to heat the bonding material 15.

In this case, the bonding material 15 is locally heated by the laser beam LB in step S5 of the bonding portion formation step. This limits, for example, temperature increases at portions other than the bonding material 15 that do not have to be heated.

(6) In step S5 of the bonding portion formation step, it is preferred that the jig main body lid 21 be in contact with and supported by the packing 28, which is arranged in the jig main body 20, in a state in which the jig main body lid 21 is spaced apart from the jig main body 20. This allows the drawing force from the recess 22 of the jig main body 20 to maintain a state in which the jig main body lid 21 further uniformly presses the glass member 12. Thus, step S5 of the bonding portion formation step is performed in a state in which the adhesiveness of the entire bonding material 15 to the glass member 12 and the bonding subject member 13 is increased. Therefore, connection failure between the glass member 12 and the bonding subject member 13 is further reduced and the reliability of the bonding portion 14 is further improved in the bonded body 11.

(7) Preferably, the stack 16 in step S1 of the stack preparation step includes the spacer 18 located between the glass member 12 and the bonding subject member 13. This prevents the component 17, such as an electronic component, which is disposed between the glass member 12 and the bonding subject member 13, from receiving unnecessary compressing force in step S4 of the pressing step and step S5 of the bonding portion formation step.

(8) Preferably, the biasing portion 25 of the apparatus for manufacturing the bonded body 11 includes the main biasing body 26, which counters the compressing force, and the biasing plate 27, which is located between the main biasing body 26 and the stack 16. In this case, the biasing plate 27 uniformly transmits the biasing force of the main biasing body 26. Thus, the biasing force of the main biasing body 26 is transmitted further uniformly to the stack 16. Therefore, the adhesiveness of the entire bonding material 15 to the glass member 12 and the bonding subject member 13 is easily increased.

MODIFIED EXAMPLES

The present embodiment may be modified as follows. The present embodiment and the following modifications can be combined as long as the combined modifications remain technically consistent with each other.

Figure 8:
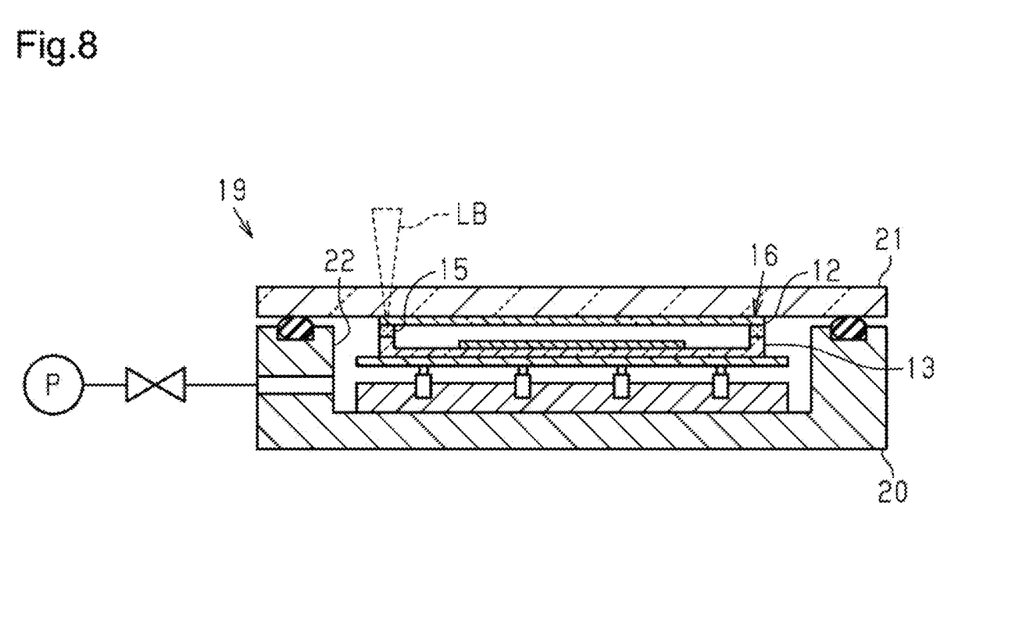
FIG. 8 is a cross-sectional view illustrating a modified example of the method for manufacturing the bonded body.

As shown in FIG. 8, the bonding subject member 13 may have the form of a container that includes an opening. In this case, the glass member 12 may be used as a lid that ensures airtightness inside the recess of the bonding subject member 13. Although not shown in the drawing, the glass member 12 may also have the form of a container that includes an opening.

The bonding material 15 does not have to include glass. For example, the bonding material 15 may be a resin bonding material. Step S5 of the bonding portion formation step does not have to be a step of heating the bonding material with the laser beam LB, and may be, for example, a step of heating the bonding material with a heat ray other than the laser beam LB or a step of curing a bonding material that includes an ultraviolet curable resin with ultraviolet light.

The jig main body lid 21 of the jig 19 may be formed from a material other than glass. Alternatively, the jig main body lid 21 may have a layered structure including layers of different materials. For example, the jig main body lid 21 may have a structure integrating the packing 28 and a glass plate.

In step S4 of the pressing step, the pump is used to discharge gas out of the recess 22 of the jig main body 20 to obtain a reduced pressure atmosphere in which the atmospheric pressure inside the recess 22 of the jig main body 20 is lower than the atmospheric pressure outside the recess 22. Alternatively, the jig 19 may be arranged in a pressurizing vessel that can be pressurized to obtain a pressurized atmosphere around the jig 19. In this case, a pipe connects the venthole 24a to the outside of the pressurized vessel. This also obtains a reduced pressure atmosphere inside the recess 22 of the jig main body 20 in which the atmospheric pressure is lower than the atmospheric pressure outside the recess 22.

In step S3 of the setting step, the stack 16 may be disposed in the recess 22 of the jig main body 20 in a state flipped upside down so that the bonding subject member 13 of the stack 16 is located closer to the jig main body lid 21. In other words, instead of disposing the stack 16 on the biasing portion 25 such that the bonding subject member 13 of the stack 16 faces the biasing plate 27 of the biasing portion 25, the stack 16 may be disposed on the biasing portion 25 such that the bonding subject member 13 of the stack 16 faces the jig main body lid 21. That is, the jig main body lid 21 may be in contact with the bonding subject member 13 of the stack 16 in step S3 of the setting step. Alternatively, step S4 of the pressing step may be a step of pressing the bonding subject member 13 of the stack 16 toward the glass member 12 of the stack 16. Alternatively, the glass member 12 may be biased toward the jig main body lid 21 in step S4 of the pressing step.

The jig main body lid 21 may be spaced apart from the glass member 12 of the stack 16 in step S3 of the setting step, and then the jig main body lid 21 may contact the glass member 12 in step S4 of the pressing step.

Step S4 of the pressing step may be performed without biasing the bonding subject member 13 of the stack 16 toward the jig main body lid 21. In other words, the biasing portion 25 may be omitted from the bonded body manufacturing apparatus.

The bonding material 15 of the stack 16 does not have to be shaped into four frames. Alternatively, the number of frames may be one, two, three, or five or more.

The bonding material 15 may be shaped as a continuous frame or a non-continuous frame. Alternatively, the bonding material 15 and the bonding portion 14 do not have to form an airtight chamber between the glass member 12 and the bonding subject member 13 and may have any form as long as the glass member 12 and the bonding subject member 13 are bonded.

The spacers 18 of the stack 16 may be omitted. The spacers 18 of the stack 16 may be in any number, shape, or dimension.

Step S1 of the stack preparation step may be performed simultaneously with step S2 of the jig preparation step. Alternatively, step S2 of the jig preparation step may be performed before step S1 of the stack preparation step.

DESCRIPTION OF REFERENCE CHARACTERS 11) bonded body, 12) glass member, 13) bonding subject member, 14) bonding portion, 15) bonding material, 16) stack, 18) spacer, 19) jig, 20) jig main body, 21) jig main body lid, 22) recess, 25) biasing portion, 26) main biasing body, 27) biasing plate, 28) packing, LB) laser beam.

The invention claimed is:

1. A method for manufacturing a bonded body that includes a glass member, a bonding subject member, and a bonding portion bonded to the glass member and the bonding subject member, the method comprising:
   a stack preparation step of preparing a stack in which a bonding material is disposed between the glass member and the bonding subject member;
   a jig preparation step of preparing a jig including a jig main body that has a recess, in which the stack is disposed, and a jig main body lid configured to close an opening of the recess in the jig main body;
   a setting step of setting the jig main body lid on the jig main body in a state in which the stack is disposed in the recess of the jig main body;

a pressing step of adjusting an atmospheric pressure in the recess of the jig main body after the setting step to press the stack with the jig main body lid; and a bonding portion formation step of forming the bonding portion, which is bonded to the glass member and the bonding subject member, from the bonding material in a state in which the stack is pressed in the pressing step, wherein the jig main body lid is a glass plate, and in the bonding portion formation step, a laser beam is transmitted through the jig main body lid and the glass member and emitted to the bonding material to heat the bonding material.

2. The method for manufacturing a bonded body according to claim 1, wherein in the setting step, the jig main body lid contacts the glass member or the bonding subject member of the stack.

3. The method for manufacturing a bonded body according to claim 1, wherein in the pressing step, the bonding subject member or the glass member is biased toward the jig main body lid.

4. The method for manufacturing a bonded body according to claim 1, wherein in the pressing step, the atmospheric pressure is adjusted by discharging gas out of the recess of the jig main body.

5. The method for manufacturing a bonded body according to claim 1, wherein the pressing step is a step of pressing the glass member of the stack toward the bonding subject member of the stack.

6. The method for manufacturing a bonded body according to claim 5, wherein the glass member has a form of a plate or a container including an opening, the bonding subject member has a form of a plate or a container including an opening, and the bonding material of the stack in the stack preparation step includes glass.

7. The method for manufacturing a bonded body according to claim 1, wherein in the bonding portion formation step, the jig main body lid is in contact with and supported by a packing arranged on the jig main body in a state in which the jig main body lid is spaced apart from the jig main body.

8. The method for manufacturing a bonded body according to claim 1, wherein the glass member and the bonding subject member each have a form of a plate, and the bonding material has a form of a plurality of frames.

9. The method for manufacturing a bonded body according to claim 8, wherein the stack in the stack preparation step includes a spacer located between the glass member and the bonding subject member.

10. The method for manufacturing a bonded body according to claim 8, further comprising:

a cutting step of cutting the bonded body after the bonding portion formation step at a position between a plurality of frames of the bonding portion formed from the plurality of frames of the bonding material.

11. The method for manufacturing a bonded body according to claim 1, wherein the jig main body lid is a glass plate having a thickness in a range of 1.5 to 5.0 mm and an elasticity in a range of 65 to 85 GPa.

12. A method for manufacturing a bonded body that includes a glass member, a bonding subject member, and a bonding portion bonded to the glass member and the bonding subject member, the method comprising:

a stack preparation step of preparing a stack in which a bonding material is disposed between the glass member and the bonding subject member;

a jig preparation step of preparing a jig including a jig main body that has a recess, in which the stack is disposed, and a jig main body lid configured to close an opening of the recess in the jig main body;

a setting step of setting the jig main body lid on the jig main body in a state in which the stack is disposed in the recess of the jig main body;

a pressing step of adjusting an atmospheric pressure in the recess of the jig main body after the setting step to press the stack with the jig main body lid; and a bonding portion formation step of forming the bonding portion, which is bonded to the glass member and the bonding subject member, from the bonding material in a state in which the stack is pressed in the pressing step, wherein the jig main body lid is a glass plate having a thickness in a range of 1.5 to 5.0 mm and an elasticity in a range of 65 to 85 GPa.

\* \* \* \* \*